United States Patent
Cox et al.

(10) Patent No.: US 8,102,513 B2
(45) Date of Patent: Jan. 24, 2012

(54) METHOD FOR POSITIONING AN OBJECT BY AN ELECTROMAGNETIC MOTOR, STAGE APPARATUS AND LITHOGRAPHIC APPARATUS

(75) Inventors: Henrikus Herman Marie Cox, Eindhoven (NL); Thomas Augustus Mattaar, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 784 days.

(21) Appl. No.: 12/243,233

(22) Filed: Oct. 1, 2008

(65) Prior Publication Data

US 2009/0097003 A1   Apr. 16, 2009

Related U.S. Application Data

(60) Provisional application No. 60/960,515, filed on Oct. 2, 2007.

(51) Int. Cl.
*G03B 27/58* (2006.01)
*G03B 27/62* (2006.01)
(52) U.S. Cl. .................................. 355/72; 355/75
(58) Field of Classification Search .............. 355/72, 355/53, 75, 77
See application file for complete search history.

(56) References Cited

U.S. PATENT DOCUMENTS

2004/0016891 A1 * 1/2004 Roes .................... 250/491.1

FOREIGN PATENT DOCUMENTS

| EP | 1357434 A1 | 10/2003 |
| JP | 10201272 A | 7/1998 |
| JP | 2004-047981 A | 2/2004 |
| JP | 2005117049 A | 4/2005 |

OTHER PUBLICATIONS

Office action in related application Japanese No. 2008-253702 mailed May 23, 2011.

* cited by examiner

*Primary Examiner* — Peter B Kim
(74) *Attorney, Agent, or Firm* — Pillsbury Winthrop Shaw Pittman LLP

(57) ABSTRACT

A method for positioning an object by an electromagnetic motor which, in use, produces a plurality of primary forces and a pitch torque associated with the primary forces. The method includes: determining a cycle which includes: determining the desired forces and torques for positioning the object, determining the primary forces to be generated by the motor, determine the pitch torque from either the primary forces or from the desired forces and torques, determine the desired signals for the motor to generate the primary forces. In a next cycle, prior to the determination of the primary forces, the desired forces and torques for positioning the object are modified using the pitch torque determined in the previous cycle of steps.

15 Claims, 8 Drawing Sheets

METHOD FOR POSITIONING AN OBJECT BY AN ELECTROMAGNETIC MOTOR, STAGE APPARATUS AND LITHOGRAPHIC APPARATUS

CROSS-REFERENCE TO RELATED APPLICATIONS

The present application claims priority to U.S. Provisional Application No. 60/960,515, filed on Oct. 2, 2007, titled "Method for Positioning an Object by an Electromagnetic Motor, Stage Apparatus and Lithographic Apparatus", the content of which is incorporated herein in its entirety by reference.

BACKGROUND

1. Field

The present invention relates to a method for positioning an object, a stage apparatus and a lithographic apparatus.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to accurately position the patterning device relative to the substrate, stage apparatuses equipped with one or more electromagnetic motors are often applied.

In general, such an electromagnetic motor includes a first part including one or more coils which can be supplied with an electrical current and a second part co-operating with the first part to generate, in use, a force between both parts. The second part may e.g. include a 1D or 2D array of permanent magnets which generates an alternating magnetic field in a given direction or a given plane, the magnetic field interacting with the current carrying coils of the first part to generate the force between both parts.

It is known that an electromagnetic motor which is used to position an object, e.g. a substrate table in a lithographic apparatus, may generate both a primary force, i.e. a force in a given direction to position the object, and, at the same time, produce a parasitic effect such as a pitch torque. Such a phenomenon is adequately described for a planar motor in e.g. EP 1 357 434 which is incorporated herein by reference in its entirety.

Due to the pitch torque, the accurate positioning of the object may be compromised; the occurrence of the pitch torque may affect the positioning of the object that is to be positioned, even when the object is not directly coupled to the electromagnetic motor, e.g. by cross-talk between the electromagnetic motor and a fine positioning stage mounted between the object and the electromagnetic motor. Although the cross-talk to such a fine positioning stage may be low, there will always be, to some extend, a transmission of forces due to e.g. cables or hoses from the motor to the fine positioning stage, thereby affection the positioning of the object.

Due to the pitch torque, the relative position between both parts that constitute the electromagnetic motor may change. In general, both parts are kept apart by either a type of bearing such as an air bearing or, the motor itself may generate the required forces for maintaining a predetermined or preferred or minimum distance between both motor parts. The occurrence of the pitch torque may disturb this to such extend that both motor parts may even come in contact with each other. This may, apart from resulting in a positioning error for the object, result in damaging either or both parts of the motor or result in contamination of the area in which the motor operates. A solution to avoid such a collision between both motor parts is to increase the distance between both parts. The skilled person will however appreciate that this would result in a reduced efficiency of the motor, since an increased distance between both parts will diminish the magnetic coupling between both parts. Apart from the reduction in efficiency, it will be clear that this approach will not satisfactory solve the occurrence of the positioning error due to the pitch torque. It is therefore suggested in EP 1 357 434 to use a modified controller to generated the required motor forces, the modified controller being arranged such that the effect of the pitch torque is substantially reduced. However, this may require an important amount of calculating power. The methods as suggested may be difficult to implement in a digital controller because the required calculations would be difficult to achieve within one sample of the controller. Delaying the output of the controller, i.e. using several samples to conduct the calculations, may affect the stability of the control loop or the positional accuracy obtained.

SUMMARY

It is desirable to provide a solution which enables, at least partly, the compensation of the pitch torque of an electromagnetic motor but uses less computational effort than known methods.

According to an aspect of the present invention, there is provided a method for positioning an object by an electromagnetic motor which, in use, produces a plurality of primary forces and a pitch torque associated with the primary forces, the method including: determining the desired forces and torques for positioning the object, determining the primary forces to be generated by the motor, determining the pitch torque from either the primary forces or the desired forces, determining the desired signals for the motor to generate the primary forces, wherein, in a next cycle prior to the determination of the primary forces, the desired forces and torques for positioning the object are modified based on the pitch torque determined in the previous cycle.

According to a further aspect of the present invention, there is provided a stage apparatus for positioning an object including an electromagnetic motor for positioning the object which, in use, produces a plurality of primary forces and a pitch torque associated with the primary forces, a control unit configured to control the electromagnetic motor, the control unit being arranged to determine the desired forces and torques to effect the positioning of the object, determine the primary forces to be provided by the electromagnetic motor based on the desired forces and torques determine the pitch torque that results from either the primary forces or the desired forces and torques, determine the desired signals for generating the primary forces, wherein, in a next cycle, prior to the determination of the primary forces, the desired forces and torques for positioning the object are modified based on the pitch torque determined in the previous cycle.

According to yet a further aspect of the present invention, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate, the lithographic apparatus further including a stage apparatus for positioning the patterning device or the substrate, the stage apparatus including an electromagnetic motor configured to position the patterning device or the substrate which, in use, produces a plurality of primary forces and a pitch torque associated with the primary forces, a control unit configured to control the electromagnetic motor, the control unit being arranged to determine the desired forces and torques to effect the positioning of the object, determine the primary forces to be provided by the electromagnetic motor based on the desired forces and torques determine the pitch torque that results from either the primary forces or the desired forces and torques, determine the desired signals for generating the primary forces, wherein, in a next cycle, prior to the determination of the primary forces, the desired forces and torques for positioning the object are modified based on the pitch torque determined in the previous cycle.

In an aspect of the invention, there is provided a method for positioning an object by an electromagnetic motor configured to produce a plurality of primary forces and a pitch torque associated with the primary forces, the method including determining the desired forces and torques for positioning the object; determining the primary forces to be generated by the motor based on the determined desired forces and torques; calculating the pitch torque from either the primary forces or the desired forces and torques, and determining the desired signals for the motor to generate the primary forces, wherein, prior to determining the primary forces, modifying the determined desired forces and torques for positioning the object using a previous value of the calculated pitch torque.

In another aspect of the invention, there is provided a stage apparatus for positioning an object including an electromagnetic motor configured to position the object, the electromagnetic motor configured to produce a plurality of primary forces and a pitch torque associated with the primary forces; and a control unit configured to control the electromagnetic motor, the control unit being configured to determine the desired forces and torques to effect the positioning of the object; determine the primary forces to be provided by the electromagnetic motor based on the desired forces and torques; calculate the pitch torque that results from either the primary forces or the desired forces and torques; and determine the desired signals for generating the primary forces, wherein, prior to determining the primary forces, the control unit is configured to modify the determined desired forces and torques for positioning the object using a previous value of the calculated pitch torque.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
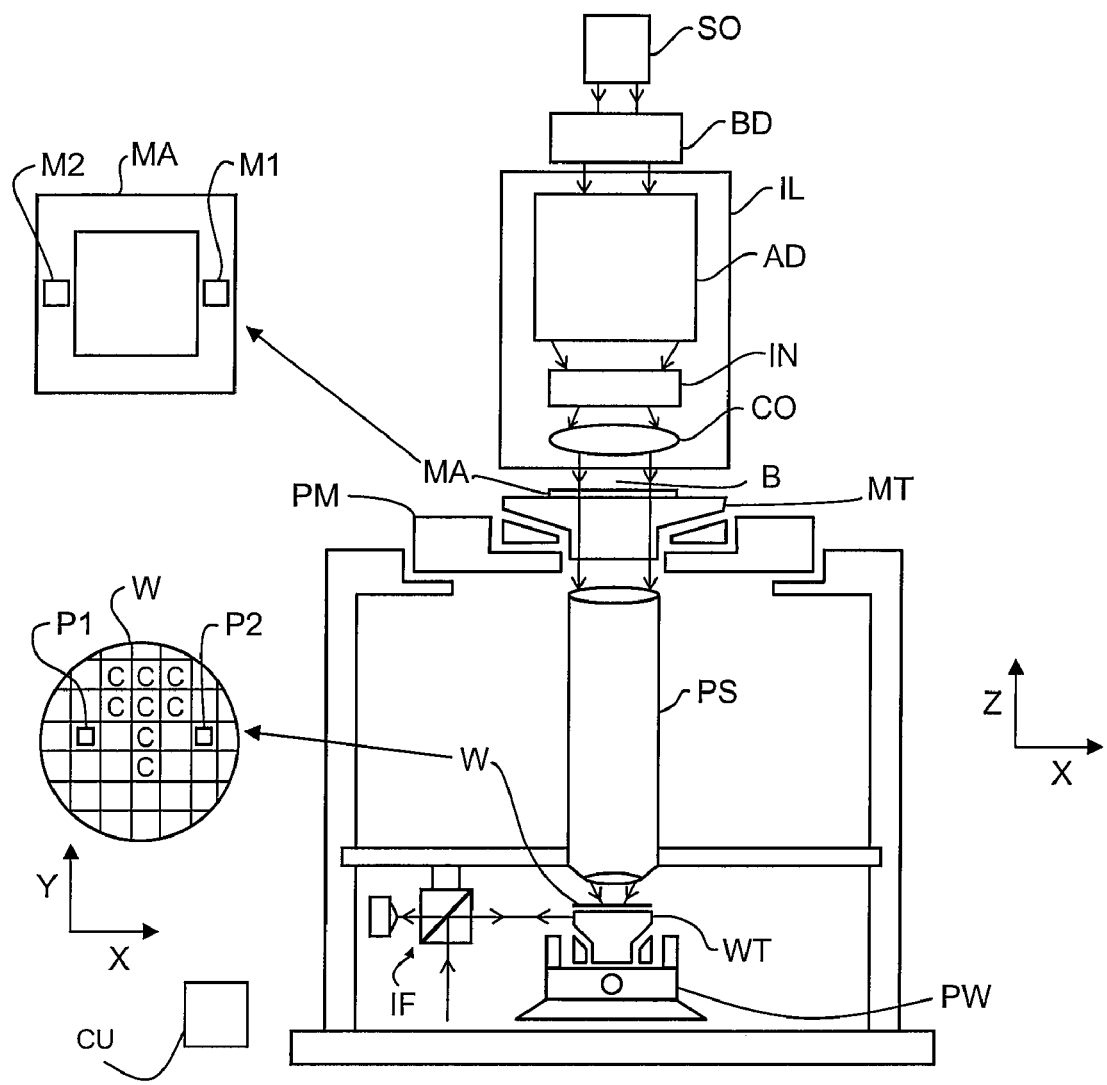
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a support structure or support or pattern support (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask)

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the support structure (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the support structure (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies.

The depicted apparatus could be used in at least one of the following modes:

1. In step mode, the support structure (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the support structure (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

FIG. 1 further depicts a control unit CU arranged to control either one or both of the positioning devices PM and PW. The positioning devices PM and PW may include one or more electromagnetic motors to enable the positioning of the patterning device (e.g. mask) MA and the substrate W, respectively. As an example, the positioning device PM may include a linear motor as further described in FIG. 3 for positioning the support structure (e.g. mask table), the positioning device PW may e.g. include a planar motor as further described in FIGS. 4a, 4b and 5a, 5b. The control unit CU is further arranged to perform the following cycle procedures: determining the desired forces and torques for positioning the object (i.e. either the support structure (e.g. mask table) or the substrate table), determining the primary forces to be generated by the electromagnetic motor (i.e. either the motor of the positioning device PM or the motor of the positioning device PW or both), determining a pitch torque that is, in use, generated by the electromagnetic motor from either the primary forces or the desired force, determining the required signals for the motor to generate the primary forces, wherein, in a next cycle prior to the determination of the primary forces, the desired forces and torques for positioning the object are modified using the pitch torque determined in the previous cycle of steps. By doing so, a simple way of addressing the effect of a pitch torque of an electromagnetic motor in a positioning device is obtained.

The control unit may include a calculator and a controller to that are configured to perform the various procedures. In an embodiment, the calculator and/or controller may be programmed with machine executable instructions to execute the various procedures.

According to an aspect of the present invention, there is provided a method of controlling the position of an object by an electromagnetic motor. The method can both be applied for controlling linear motors or planar motors, examples of which are described below. The control method can be described by the flow-chart as shown in FIG. 2a or 2b.

Figure 2A:
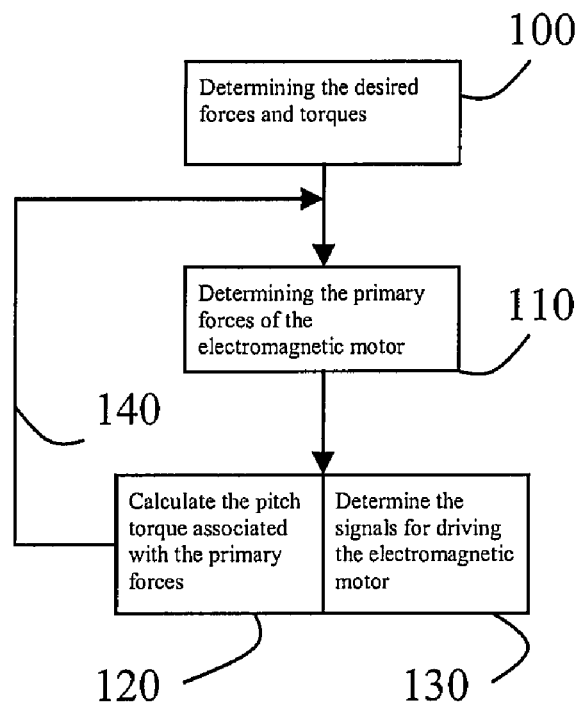
FIG. 2a schematically depicts a first flow-chart of an embodiment of the present invention.
Figure 2B:
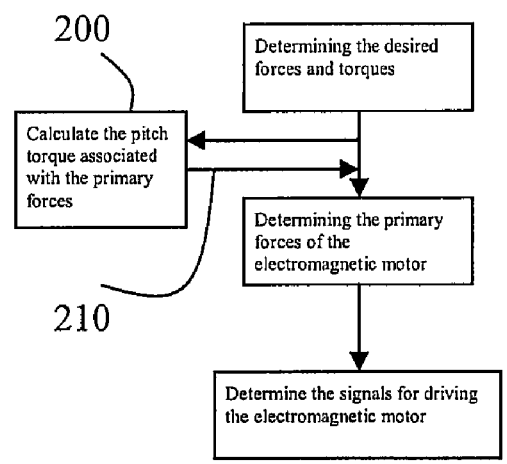
FIG. 2b schematically depicts a second flow-chart of an embodiment of the present invention.

FIG. 2a schematically depicts a first procedure 100 of determining the desired (or required) forces and torques for positioning an object. This procedure 100 may e.g. include a comparison between a measured position with a desired position. Alternatively, or in addition, this procedure may also take into account an output signal of a controller. The procedure for determining the desired forces and torques for positioning the object may further take into account the physical parameters of the object to be displaced, such parameter may e.g. be the weight or inertia of the object, but also parameters of the environment of the object may be taken in to account. As a result of this procedure, the desired forces and torques are obtained which, when applied to the object, would result in the desired positioning of the object or would result in a correction of the position. In a next procedure 110, the desired forces are transformed into the primary forces that need to be generated by the electromagnetic motor. This transformation takes into account the actual position and layout of the electromagnetic motor in relation to the object that is displaced.

In case an electromagnetic motor is supplied with an electric current or a set of electric currents (e.g. a two- or three phase current system) it may generate a force in a given direction which may be maintained substantially constant when the motor is displaced in the given direction by a proper commutation of the supplied current. This force is referred to as the primary force of the electromagnetic motor. The transformation that is done in the second procedure 110 therefore transforms the desired forces and torques to position the object into forces which can be generated by the motor or motors as applied. This process is also referred to as Gain Balancing, a more detailed description of this process can e.g. be found in EP 1 357 434, incorporated herein by reference. It will be appreciated that in the method as described by the present invention, the Gain Balancing does not take into account any spurious effects of the motor such as an occurring pitch torque. The Gain Balancing as conducted in procedure 110 of FIG. 2a only takes into account the primary forces that can be generated by the electromagnetic motor. The occurring spurious torques (parasitic torques which would occur when the primary forces are generated by the motor) are not incorporated in the Gain Balancing step. It can be noted that it would be possible to take the parasitic torques into account during the Gain Balancing step (an example of this is e.g. the second embodiment as described in EP 1 357 434), this however may have the following drawback:

The computational effort for performing the Gain Balancing may increase: it can be shown that the parasitic torques (i.e. the pitch torque) that occur when a linear or planar motor displaces in a given direction do not remain constant but depend on the relative position of both co-operating parts of the motor (i.e. the first part including one or more coils which can be supplied with an electrical current and the second part co-operating with the first part which, in general, will include an array of alternating polarized permanent magnets. As a consequence, since the parasitic torque depends on the relative position of both motor parts, this relative position needs to be known and taken into account in the Gain Balancing process. This may require a large computational effort which may influence the performance of the controller.

It is therefore beneficial not to incorporate the effect of the pitch torque during the Gain Balancing process.

In a next procedure of the method according to an embodiment of the invention, the primary forces as determined by the Gain Balancing process are used to determine the pitch torque that is associated with these forces. This calculation can e.g. be based on the relative position between both motor parts, this relative position may be determined in different ways, examples of which are described below. At the same time as the pitch torque is determined, the signals for powering the electromagnetic motor may be determined based on the desired primary forces, 130. This process may involve the determination of the desired commutation angle for the current to be supplied to the coil or coils of the motor. This process may also be based on the relative position between both motor parts. The relative position between both motor parts need not be actually measured by a position measurement system arranged between both parts, the relative position may also be derived from a position measurement of one of the motor parts, in case the other motor part remains stationary.

In order to take into account the pitch torque that is calculated from the primary forces, the control method according to an embodiment of the present invention uses the calculated pitch torque to modify the desired forces and torques for positioning the object, prior to the calculation of the primary forces. This is depicted in FIG. 2a by the feedback loop 140.

It can further be mentioned that the present invention beneficially provides a possibility to assess the calculated pitch torque for diagnostic purposes, as the calculated pitch torque is available as a signal in the controller. Using data-tracing, this signal may be visualised and analysed, unlike in the second embodiment of EP 1 357 434.

In order for this modification not to delay the process to obtain the desired signals to generated the primary forces, the pitch torque as calculated in a previous step is used rather than combining the calculated pitch torque with an earlier set of primary forces, as e.g. done in the first embodiment as described in EP 1 357 434. The method as described may be shown to have good results in compensating for the pitch torque while being easy to implement in a digital controller. Compared to known methods, the described method needs less computational power.

In an embodiment of the present invention, the modification consists of subtracting the calculated pitch torque from the desired forces and torques, prior to the calculation of the primary forces.

It can further be noted that, in case the Gain Balancing is performed without taking into account the parasitic effects such as the pitch torque, the Gain Balancing process may be expressed as a matrix multiplication in which the matrix elements may be constant. So, by performing a matrix multiplication on the desired forces and torques, the primary forces for the electromagnetic motor may be obtained. In such a situation, it will be appreciated by the skilled person that the pitch torque associated with the primary force (or forces) may equally be obtained from the desired forces, as the primary forces may be expressed as a function of the desired forces. FIG. 2b describes the flow-chart for this situation. Based on the calculated desired forces for positioning the object, the pitch torque associated with these forces is calculated, 200. The calculated pitch torque may then, as in the process of FIG. 2a be used, in a next sample, to modify the desired forces and torques, prior to the determination of the primary forces of the motor, as indicated by the arrow 210.

The method as described may e.g. be applied in a stage apparatus arranged to position an object in e.g. a lithographic apparatus. In such an apparatus, both the patterning device and the substrate (onto which a pattern of the patterning device is projected or printed) need accurate positioning.

The following figures show, by way of example, some electromagnetic motor for which the control method may be applied.

Figure 3:
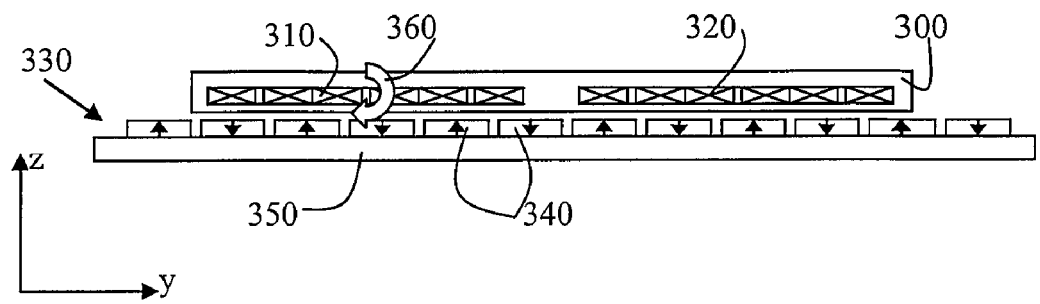
FIG. 3 schematically depicts an electromagnetic motor that can be applied in an embodiment of the present invention.

FIG. 3 schematically shows a cross-sectional view of an electromagnetic motor including a first part 300, the part including a first coil-set (or forcer) 310 and a second coil-set (or forcer) 320. The first part is further arranged to co-operate with a second part 330 including an array of permanent magnets 340 (of which the polarization is indicated by the arrows inside the magnets), the array of magnets being mounted to a member 350 which, preferably, includes a magnetically conductive material such as Iron. In order to generate a force between both parts, the coil-sets (or forcers) may be supplied with an electric current or currents. In the arrangement as depicted, each coil-set includes three coils which may be supplied from e.g. a three-phase power supply. When the appropriate commutation angle is applied for the currents, one may ensure that when both parts displace relative to each other in the Y-direction a constant force in the Y-direction can be generated. This Y-force is therefore considered a primary force of the motor. It may further be noted that the motor as shown may also, when the appropriate commutation is applied, generate a force in the Z-direction which may be maintained substantially constant when the first part 300 displaces relative to the second part 330 in the Y-direction. This force therefore also constitutes a primary force of the motor. The primary forces of the motor as shown, are actually the resulting forces of the individual forces generated by the different coils in each coil-set. As these individual forces are not constant when both motor parts displace relative to each other (since both the current in the individual coils and the interaction with the magnetic field changes due to the displacement), a position dependent torque component may also be generated in addition to the resulting force in the Y-direction or Z-direction. This torque is schematically depicted in FIG. 3 by the arrow 360 and is a torque about the X-axis, which is perpendicular to the YZ-plane of the figure. As can be seen, the torque may be expressed as a function of the generated primary force and the relative position between both motor parts.

In case the electromagnetic motor includes more that one forcer, as is the case in FIG. 3, it will be appreciated that each forcer may generate, during operation, such a parasitic torque. The resulting torque of all forcers is actually the pitch torque that can, at least partly, be corrected by the process as shown in FIG. 2a or 2b.

Figure 4A:
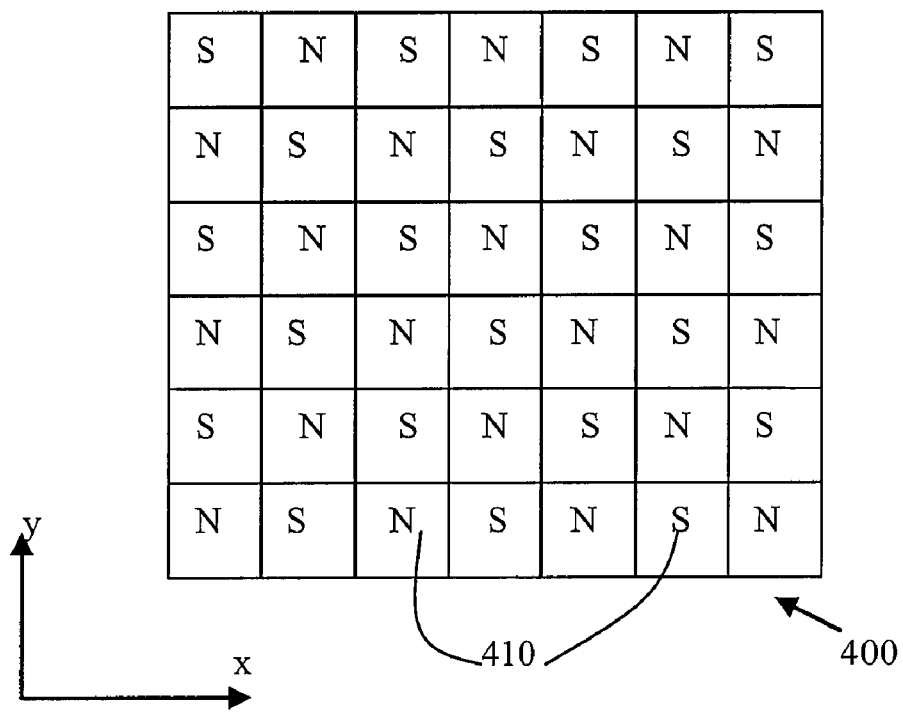
FIG. 4a schematically depicts a 2D permanent magnet array that can be applied in a planar motor that can be applied in a stage apparatus according to an embodiment of the present invention.
Figure 4B:
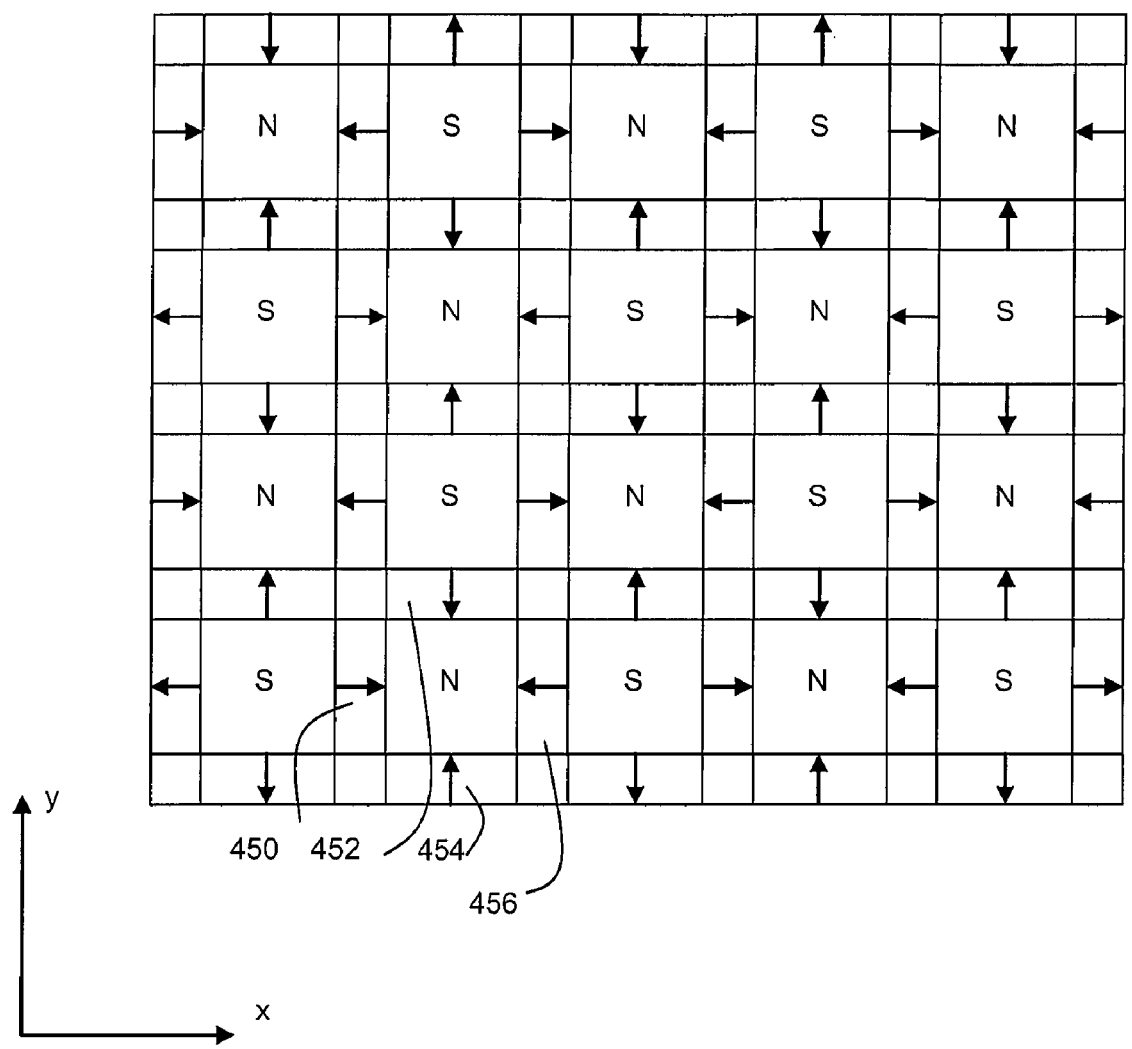
FIG. 4b schematically depicts a further 2D permanent magnet array that can be applied in a planar motor that can be applied in a stage apparatus according to an embodiment of the present invention.
Figure 5A:
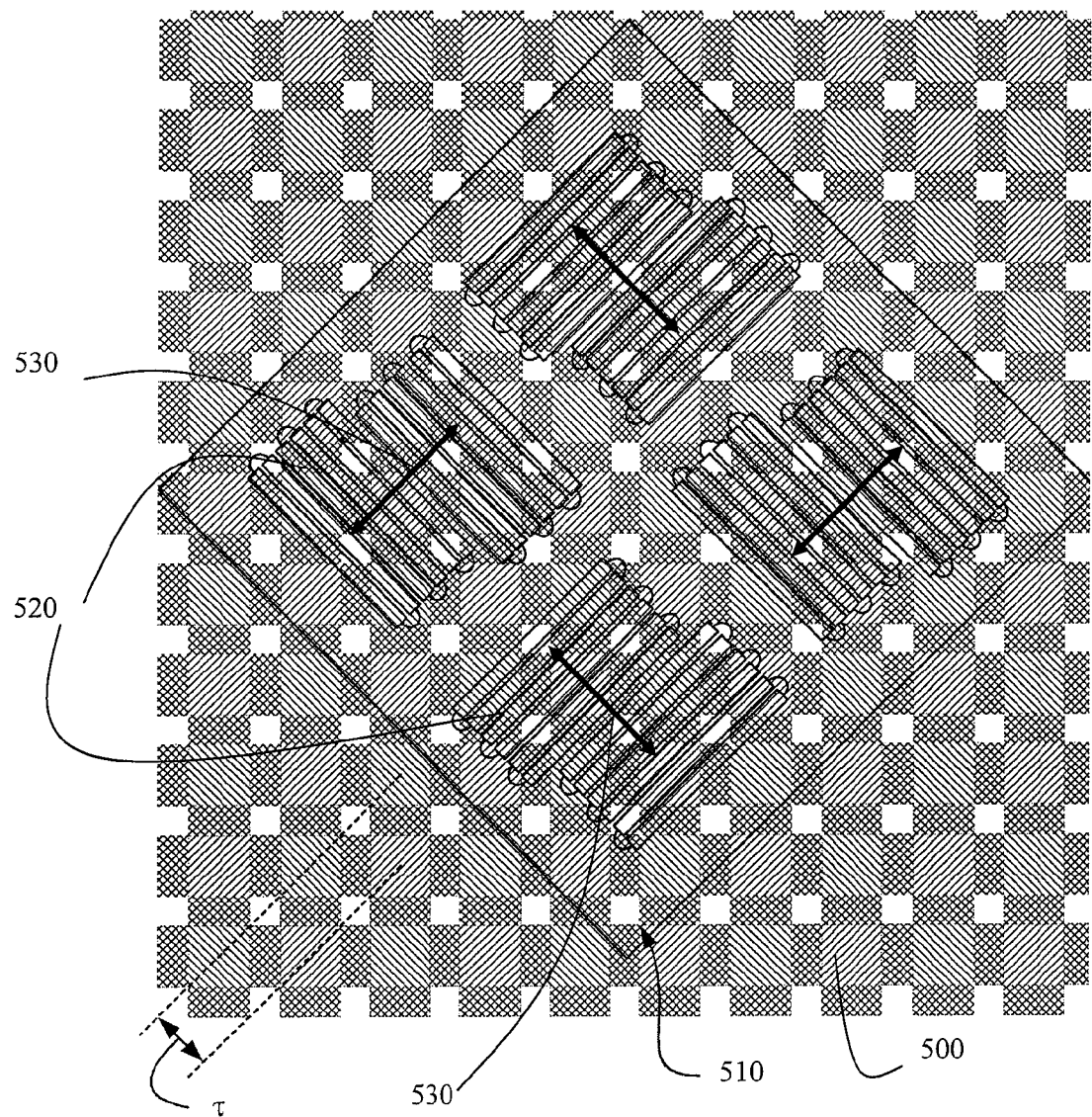
FIG. 5a schematically depicts a top-view of a planar motor that can be applied in an embodiment of the present invention.
Figure 5B:
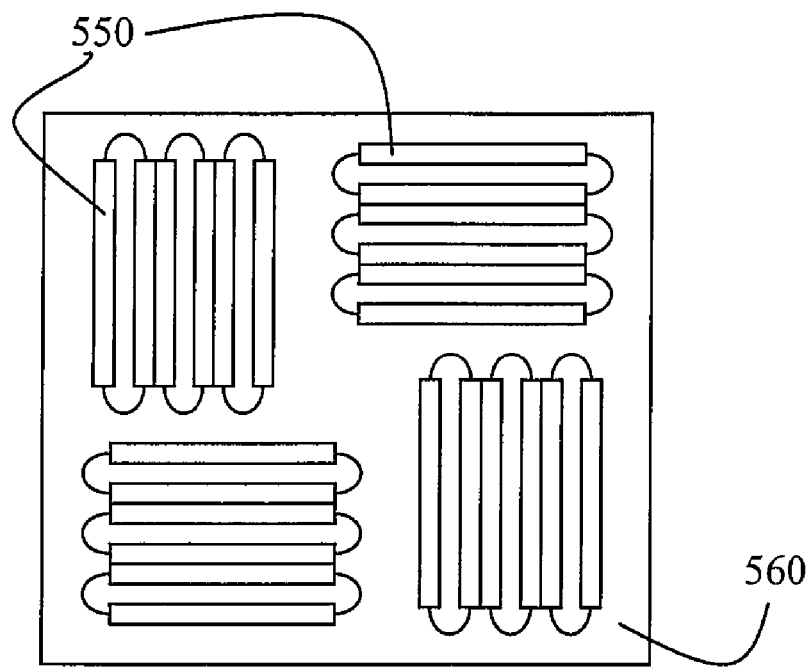
FIG. 5b schematically depicts a possible lay-out of a forcer that can be applied in a planar motor that can be applied in an embodiment of the present invention.

The method of controlling the position of an object may also be applied in a planar motor as described in EP 1 357 434. Such a planar motor can be seen as a 2D version of the motor as depicted in FIG. 3. In addition to forcers arranged to generate forces in the Y-direction, such a planar motor includes one or more forcers arranged to generate forces in the X-direction, which, in general, is perpendicular to the Y-direction. In order to generate the force (or forces) in the X-direction, the permanent magnet array of the planar motor is arranged in such manner that an alternating magnetic field is generated both in X- and Y-direction. This may e.g. be obtained by a checkerboard pattern of permanent magnets 400 as shown in FIG. 4a. References N and S inside the magnets indicate the polarization (North or South) of the different magnets 410. As will be appreciated by the skilled person, the efficiency of the planar motor may be improved by using a so-called 2D Halbach array for the permanent magnet assembly. Such a magnet configuration is shown in FIG. 4b wherein magnets 450, 452, 454 and 456 are permanent magnets which are polarized as indicated by the arrows inside the magnets. FIG. 5a schematically shows a top view of a planar motor that may be applied in an embodiment of the present invention. FIG. 5a shows the 2D array of permanent magnets 500 together with the forcer 510 of the motor. The forcer of the planar motor as shown includes a plurality of coil-sets 520 arranged to generate a primary force in the direction as indicated by the arrows 530. FIG. 5a further indicates the magnetic pole pitch τ describing the magnetic period of the permanent magnet array. FIG. 5b shows an alternative arrangement of coil-sets 550 for a forcer 560 of a planar motor.

As already mentioned above, the pitch torque as generated by the forcer or forcers of the electromagnetic motor depends on the relative position of both motor parts and may be expressed as a function of the primary force (or forces) of the motor and the relative position of both motor parts. One way to obtain this information is to provide a measurement system between both parts of the motor to measure the relative position. As an example of such a measurement system, the forcer part of the motor (including the coil-set or coil-sets) may be provided with one or more Hall sensors arranged to measure the magnetic field of the permanent magnet array (or assembly). The output signal of the Hall Sensor(s) may provide the desired position information to allow the determination of the pitch torque which needs to be corrected or taken into account. Alternative measurement systems such as encoder based measurement systems may equally be applied.

Figure 6:
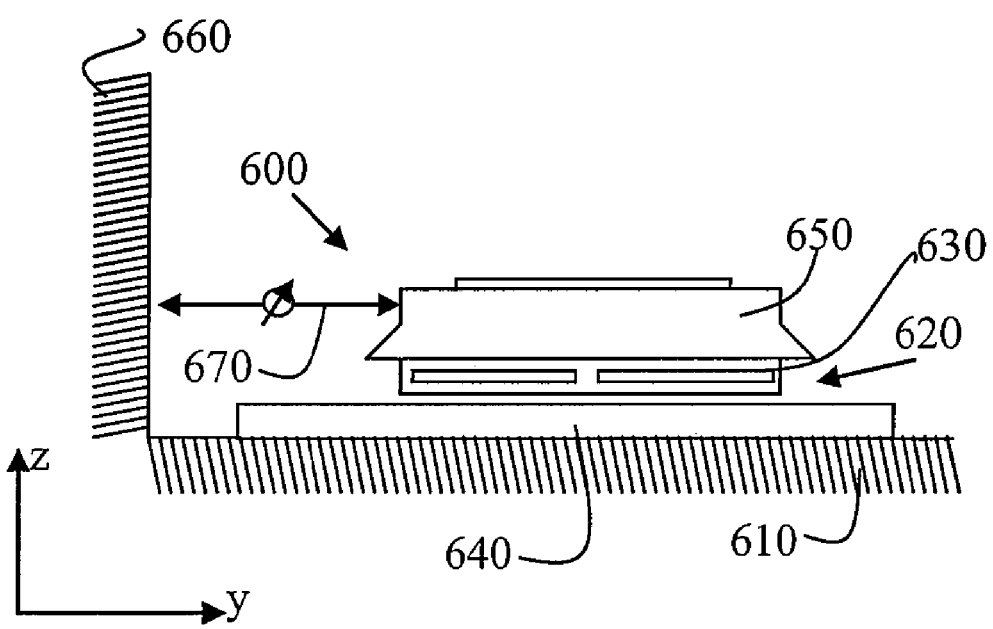
FIG. 6 schematically depicts a stage apparatus according to an embodiment of the invention.

In case the motor is applied in a stage apparatus for positioning an object, a position measurement system may already be present for measuring the position of the object. Such a measurement system may e.g. include an interferometer system or an encoder based system and may e.g. allow measuring the position of the object relative to a reference of the apparatus. Combined with positional information of the object relative to the forcer part of the motor and positional information regarding the position of the permanent magnet part relative to the reference, the relative position of both motor parts may be obtained. Such a set-up is illustrated in FIG. 6. FIG. 6 schematically depicts a stage apparatus 600 mounted to a base 610. The stage apparatus includes an electromagnetic motor 620 including a first part 630 (e.g. a forcer such as depicted in FIGS. 3, 5a or 5b), arranged to co-operate with a second part 640 (which is mounted to the base 610 and which may e.g. be a permanent magnet array as shown in FIGS. 3, 4a, 4b or 5a)) to displace an object 650 (e.g. a substrate table of a lithographic apparatus) in the Y-direction relative to a reference 660 of the apparatus. In addition, the apparatus includes a position measurement system 670 configured to measure the position of the object 650 relative to the reference 660. In case the position of the second part 640 of the electromagnetic relative to the reference 660 is fixed, the position measurement of the object table may be applied to determine the position of the first part of the electromagnetic motor relative to the second part, which position information may be desired to determine the pitch torque that is generated by the electromagnetic motor.

Figure 7:
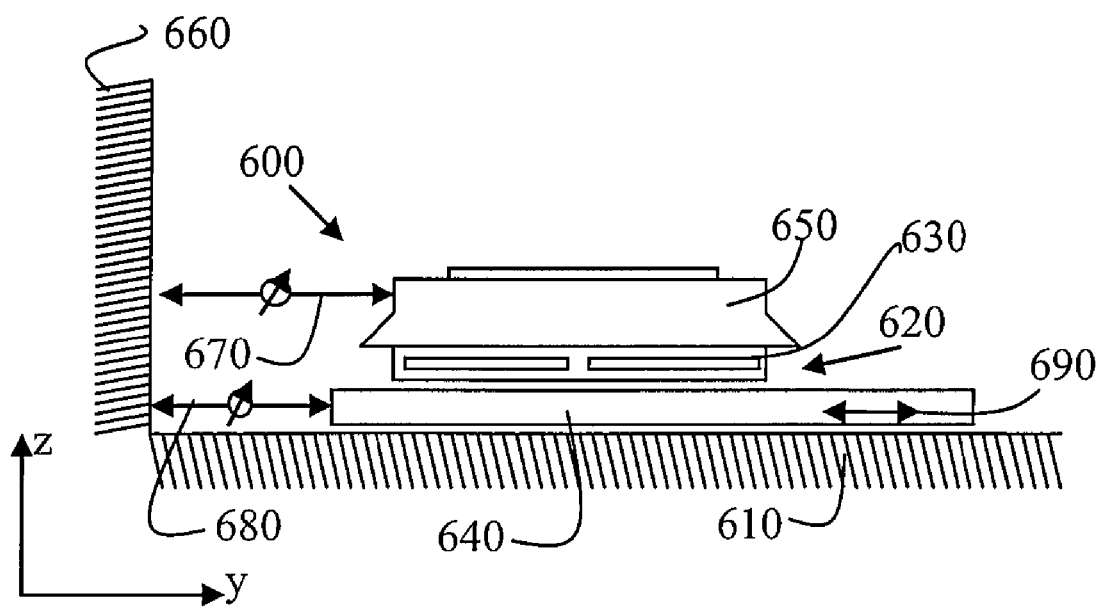
FIG. 7 schematically depicts a further stage apparatus according to an embodiment of the invention.

In apparatus in which a high positioning accuracy of an object (such as the positioning of a support structure (e.g. mask table) or substrate table) is desired in a lithographic apparatus, a balance mass arrangement is often applied to mitigate or avoid excitation of critical parts by the reaction forces of stage positioning devices. Such a balance mass arrangement is schematically depicted in FIG. 7. Corresponding reference numbers as applied in FIG. 6 are used to indicate corresponding part of the stage apparatus. In contrast to FIG. 6 however, the second part 640 of the electromagnetic motor 620 is not mounted to the base 610 but is arranged in such manner that it is displaceable (indicated by the arrow 690), substantially without friction relative to the base 610, at least in a direction corresponding to the direction of a primary force of the motor. By doing so, the reaction force of the primary force, which acts on this part 640 may cause this part to displace in opposite direction as the first part 630 of the motor. By such an arrangement, excitation of critical machine parts by the reaction force can be avoided or mitigated.

In order to determine the position of the first motor part relative to the second part in such a balance mass arrangement, a second measurement system 680 may be applied which is e.g. arranged to determine the position of the second part 640 of the electromagnetic motor 620 relative to the reference 660. Combined with the position information obtained from the position measurement system 670, the position of the first motor part relative to the second may be obtained and used to determine the pitch torque of the motor.

Figure 8:
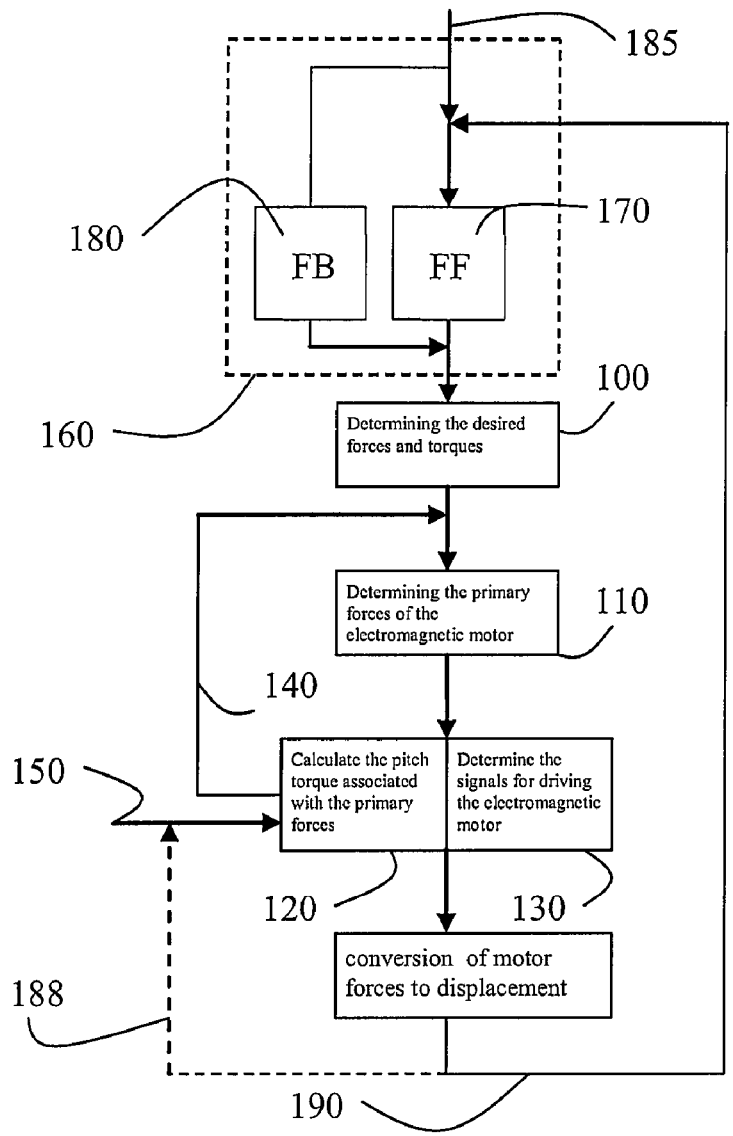
FIG. 8 schematically depicts a third flow-chart of an embodiment of the present invention.

FIG. 8 schematically depicts a more detailed flow-chart of the method according to an embodiment of the present invention in which the use of the position measurement to calculate the pitch torque is indicated by the arrow 150. In addition, FIG. 8 schematically shows a controller 160 which may include a feedback loop FB 170 and a feedforward loop FF 180. The controller may make use of a set-point 185 of the object to be positioned combined with a feedback of the position measurement 190 of the object. Note that this position measurement of the object may also be used in the calculation of the pitch torque (as described in FIG. 7), as indicated by the dotted line 188.

The method for taking into account the effect of a pitch torque of an electromagnetic motor, by e.g. FIG. 2a, 2b or 8 may be further improved as follows: As described above, the calculated pitch torque is used in the described method to modify the desired forces and torques. The pitch torque that is used for this is, however, calculated in a previous sample. As such, the calculated pitch torque does not take into account the actual displacement of the motor that may occur. This displacement may be taken into account as follows: rather than calculating the pitch torque based on the actual relative position of both motor parts, the pitch torque may be calculated based on an estimation of the relative position of both motors in the next sample. This estimate may be obtained from the actual relative position of both parts combined with e.g. information on the actual velocity of the motor. Based on the actual velocity and knowing the time-interval between two samples, one can estimate the position of the motor in the next sample and use this position to calculate the pitch torque. Instead of using the actual velocity, which may be obtained from a measurement, the velocity may be obtained from two or more position measurements. Alternatively, in case the set-point for the positioning also includes a velocity setpoint, this velocity set-point may be applied to obtain an estimate of the relative position of both motor parts in the next sample. In addition to using the velocity to obtain an improved position reference for calculating the pitch torque, the acceleration of the motor may be used to provide a further improvement.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method for positioning an object by an electromagnetic motor configured to produce a plurality of primary forces and a pitch torque associated with the primary forces, the method comprising a cycle that includes:
   determining the desired forces and torques for positioning the object;
   determining the primary forces to be generated by the motor;
   determining the pitch torque from either the primary forces or the desired forces and torques; and
   determining the desired signals for the motor to generate the primary forces,
   wherein, in a next cycle, prior to determining the primary forces, the desired forces and torques for positioning the object are modified using the pitch torque determined in a previous cycle.

2. The method according to claim 1, wherein, prior to determining the primary forces, the desired forces and torques are modified by subtracting the pitch torque determined in the previous cycle.

3. The method according to claim 1, wherein the pitch torque is determined based on a position measurement of the electromagnetic motor.

4. The method according to claim 3, wherein the pitch torque is determined based on a velocity measurement or a velocity set-point of the object.

5. A stage apparatus for positioning an object comprising:
   an electromagnetic motor configured to position the object, the electromagnetic motor configured to produce a plurality of primary forces and a pitch torque associated with the primary forces; and
   a control unit configured to control the electromagnetic motor, the control unit being arranged to perform a cycle that includes
      determining the desired forces and torques to effect the positioning of the object;
      determining the primary forces to be provided by the electromagnetic motor based on the desired forces and torques;
      determining the pitch torque that results from either the primary forces or the desired forces and torques; and
      determining the desired signals for generating the primary forces,
   wherein, in a next cycle, the primary forces are determined based on the desired forces and torques and the determined pitch torque.

6. The stage apparatus according to claim 5, wherein the control unit is adapted to subtract the determined pitch torque from desired forces and torques to determine the primary forces.

7. The stage apparatus according to claim 6, wherein the pitch torque is determined based on a position measurement of the electromagnetic motor.

8. The stage apparatus according to claim 7, wherein the pitch torque is determined based on a velocity measurement or a velocity set-point of the object.

9. The stage apparatus according to claim 5, wherein the plurality of primary forces are, in use, generated by a respective plurality of coil-sets, each producing at least one primary force in a given direction and a pitch torque associated with the primary force.

10. The stage apparatus according to claim 9, wherein the electromagnetic motor comprises a planar motor arranged to position the object in a first direction and a second direction.

11. The stage apparatus according to claim 10, wherein a permanent magnet array of the planar motor is, in use, displaceable substantially without friction in both the first and the second direction.

12. The stage apparatus according to claim 10, wherein a position of the permanent magnet array is used to determine the desired motor signals and the pitch torque.

13. A lithographic apparatus comprising:
   an illumination system configured to condition a radiation beam;
   a pattern support constructed to support a patterning device, the patterning device being capable of imparting the radiation beam with a pattern in its cross-section to form a patterned radiation beam;
   a substrate support constructed to hold a substrate;
   a projection system configured to project the patterned radiation beam onto a target portion of the substrate; and
   a stage apparatus configured to position one of the supports, the stage apparatus comprising:
      an electromagnetic motor configured to position said one of the supports, the electromagnetic motor configured to produce a plurality of primary forces and a pitch torque associated with the primary forces; and
      a control unit configured to control the electromagnetic motor, the control unit being arranged to perform a cycle that includes
         determining the desired forces and torques to effect the positioning of said one of the supports;
         determining the primary forces to be provided by the electromagnetic motor based on the desired forces and torques;
         determining the pitch torque that results from either the primary forces or the desired forces and torques; and
         determining the desired signals for generating the primary forces,
      wherein, in a next cycle, the primary forces are determined based on the desired forces and torques and the determined pitch torque.

14. A method for positioning an object by an electromagnetic motor configured to produce a plurality of primary forces and a pitch torque associated with the primary forces, the method comprising:
   determining the desired forces and torques for positioning the object;
   determining the primary forces to be generated by the motor based on the determined desired forces and torques;

calculating the pitch torque from either the primary forces or the desired forces and torques, and determining the desired signals for the motor to generate the primary forces, wherein, prior to determining the primary forces, modifying the determined desired forces and torques for positioning the object using a previous value of the calculated pitch torque.

15. A stage apparatus for positioning an object comprising:

an electromagnetic motor configured to position the object, the electromagnetic motor configured to produce a plurality of primary forces and a pitch torque associated with the primary forces; and a control unit configured to control the electromagnetic motor, the control unit being configured to determine the desired forces and torques to effect the positioning of the object;

determine the primary forces to be provided by the electromagnetic motor based on the desired forces and torques;

calculate the pitch torque that results from either the primary forces or the desired forces and torques; and determine the desired signals for generating the primary forces, wherein, prior to determining the primary forces, the control unit is configured to modify the determined desired forces and torques for positioning the object using a previous value of the calculated pitch torque.

* * * * *